United States Patent
Yokokawa et al.

(10) Patent No.: US 7,091,107 B2
(45) Date of Patent: Aug. 15, 2006

(54) METHOD FOR PRODUCING SOI WAFER AND SOI WAFER

(75) Inventors: Isao Yokokawa, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 51 days.

(21) Appl. No.: 10/782,838

(22) Filed: Feb. 23, 2004

(65) Prior Publication Data

US 2004/0166650 A1    Aug. 26, 2004

(30) Foreign Application Priority Data

Feb. 26, 2003   (JP)   ............... 2003-049415

(51) Int. Cl.
| | |
|---|---|
| H01L 21/30 | (2006.01) |
| H01L 21/46 | (2006.01) |
| H01L 21/00 | (2006.01) |
| H01L 21/76 | (2006.01) |

(52) U.S. Cl. ................ 438/455; 438/404; 438/42; 438/458

(58) Field of Classification Search ............ 438/404, 438/406–407, 42, 458–459, 455
See application file for complete search history.

(56) References Cited

U.S. PATENT DOCUMENTS 6,140,210 A * 10/2000 Aga et al. ............... 438/458
6,284,629 B1 * 9/2001 Yokokawa et al. ......... 438/459
6,653,209 B1 * 11/2003 Yamagata .................. 438/459

FOREIGN PATENT DOCUMENTS

| JP | A 5-211128 | 8/1993 |
|---|---|---|
| JP | A-11-307472 | 11/1999 |

* cited by examiner

Primary Examiner—Chuong A. Luu
(74) Attorney, Agent, or Firm—Oliff & Berridge, PLC

(57) ABSTRACT

There is disclosed a method of producing an SOI wafer in which an SOI layer is formed on a buried oxide film by, at least implanting at least one kind of ion of hydrogen ion and a rare gas ion into the surface portion of a bond wafer to form an ion-implanted layer, bonding the bond wafer and a base wafer to each other through an oxide film, and delaminating the resultant bonded wafer at the ion-implanted layer, wherein assuming that X [nm] represents the thickness of the buried oxide film and Y [nm] represents the thickness of the SOI layer in the SOI wafer immediately after delaminating at the ion-implanted layer, when the thickness X of the buried oxide film is $X \leq 100$, in forming the ion-implanted layer, the ion implantation is carried out with the ion implantation conditions being set such that the sum $X+Y$ of the thickness of the buried oxide film and the thickness of the SOI layer satisfies $X+Y > 1500-14X$, after which the bonding process and the delaminating process are carried out and, thereafter, a thinning treatment of the SOI layer is carried out to make the SOI layer into a thin film having a predetermined thickness. Thereby, there can be provided a method of producing an SOI wafer capable of producing a high-quality SOI wafer at a high yield without generating any blister and any void.

8 Claims, 4 Drawing Sheets

METHOD FOR PRODUCING SOI WAFER AND SOI WAFER

BACKGROUND OF THE INVENTION

1. Field of the Invention

The present invention relates to a method of producing an SOI wafer having an SOI (Silicon On Insulator) structure in which a silicon layer is formed on an insulator, and to an SOI wafer produced by use of the method.

2. Description of the Related Art

In these years, an SOI wafer having an SOI structure in which a silicon layer (SOI layer) is formed on an insulator has been especially attracting attention as a wafer for a high-performance LSI for a electronic device because the SOI wafer is excellent in high-speed property, low-power consumption, high breakdown voltage, environmental resistance etc. for the device.

Representative production methods of the SOI wafer are SIMOX method in which an oxide film is formed in a silicon wafer by subjecting, to a heat treatment at a high temperature after implanting oxygen ion into the wafer at a high concentration, a method called bonding method, etc. The bonding method is a method of producing an SOI wafer in which an SOI layer is formed on a buried oxide film being an insulator, by, after forming an oxide film on at least one of a bond wafer to form an SOI layer and a base wafer to be a supporting substrate and bonding the bond wafer with the base wafer through the oxide film(s), making the bond wafer into a thin film.

Known as production methods of the SOI wafer utilizing the bonding method are grinding and polishing method, PACE (Plasma Assisted Chemical Etching) method, ion implantation delamination method (also called "Smart Cut" (registered trademark) method, see Japanese Patent Application Laid-open Pub. No. 05-211128), ELTRAN method, etc (see "Science in Silicon", published by Realize publishers, pp. 443-496).

Here, the ion implantation delamination method will be described with reference to FIG. 2. First, two silicon wafers of a base wafer 11 and a bond wafer 12 are prepared (Step (a')). Next, after forming an oxide film 13 on at least one of these wafers (in this case, the bond wafer) (Step (b')), an ion-implanted layer 14 is formed inside the bond wafer 12 by implanting at least one kind of ion of hydrogen ion and a rare gas ion into the bond wafer 12 (Step (c')). Then, after the ion-implanted surface of the bond wafer 12 is bonded with the base wafer 11 through the oxide film 13 (Step (d')), the bond wafer 12 is delaminated at the ion-implanted layer 14 as a cleavage plane (the delaminating plane) by subjecting to a delaminating heat treatment (Step (e')), thereafter, an SOI wafer 17 in which an SOI layer 16 is formed on a buried oxide film 15 can be produced by subjecting further to a boding heat treatment for strengthening the bonding between the wafers, a mirror polishing process called "touch polishing" in which polishing stock removal is very small and other processes (Step (f')).

However, when producing an SOI wafer, once a mirror polishing process including a mechanical element has been carried out at the final stage as described above, a problem that the uniformity of the thickness of the SOI layer achieved by the ion implantation and delaminating is degraded occurs because the polishing stock removal is not uniform. Furthermore, since the mirror polishing is performed after the bonding heat treatment, the method has many steps and is complicated and disadvantageous also in terms of cost.

In order to solve such a problem, Japanese Patent Application Laid-open Pub. No. 11-307472 for example discloses a technique in which, after wafers have been bonded to each other and a bonding heat treatment has been carried out for them, a high-temperature heat treatment is carried out in hydrogen or Ar atmosphere in order to reduce the surface roughness and crystal defects of the SOI layer of an SOI wafer without carrying out any mirror polishing.

Furthermore, with the higher integration of semiconductor devices in these years, production of a higher-quality SOI wafer is sought and, for example, an SOI wafer having a thinner buried oxide film and an SOI wafer for which crystal quality of its SOI layer is improved are sought.

Generally, when an SOI wafer is produced in the ion implantation delamination method as described above, in order to form a buried oxide film having a desired thickness in the SOI wafer, the SOI wafer is produced by forming an oxide film formed on at least one of a bond wafer and a base wafer such that the thickness of the oxide film is the same as a desired thickness of the buried oxide film and, thereafter, bonding these wafers to each other.

However, when producing an SOI wafer having a thin buried oxide film having a thickness of, for example, 100 nm or less, after wafers are bonded to each other, in carrying out a delaminating heat treatment, as shown in FIG. 3, there are often cases where a blister 34 and a void 35 are generated in the SOI wafer in which a buried oxide film 32 and an SOI layer 33 are laminated on a base wafer 31 and unbonded portions are caused. Then, there has been a problem that, as the thickness of the buried oxide film of the SOI wafer becomes thinner, these blister and void tend to be generated more, and good wafers become more difficult to obtain and the yield becomes worsened.

From now on, the thickness of a buried oxide film formed in an SOI wafer is expected to proceed in such a course as it is reduced from 100 nm to 80 nm, further, 50 nm or less. Therefore, it is desired to produce an SOI wafer at a high yield without generating any blister and any void even when the thickness of the buried oxide film is reduced.

SUMMARY OF THE INVENTION

The present invention was conceived in view of the above problems. The object of the present invention is to provide a method of producing an SOI wafer, capable of producing a high-quality SOI wafer at a high yield without generating any blister and any void even when the thickness of a buried oxide film is reduced to 100 nm or less.

In order to achieve the above object, according to the present invention, there is provided a method of producing an SOI wafer in which an SOI layer is formed on a buried oxide film by, at least implanting at least one kind of ion of hydrogen ion and a rare gas ion into the surface portion of a bond wafer to form an ion-implanted layer, bonding the bond wafer and a base wafer to each other through an oxide film, and delaminating the resultant bonded wafer at the ion-implanted layer, wherein assuming that X [nm] represents the thickness of the buried oxide film and Y [nm] represents the thickness of the SOI layer in the SOI wafer immediately after delaminating at the ion-implanted layer, when the thickness X of the buried oxide film is $X \leq 100$, in forming the ion-implanted layer, the ion implantation is carried out with the ion implantation conditions being set such that the sum X+Y of the thickness of the buried oxide film and the thickness of the SOI layer satisfies $X+Y>1500-14X$, after which the bonding process and the delaminating process are carried out and, thereafter, a thinning treatment of the SOI layer is carried out to make the SOI layer into a thin film having a predetermined thickness.

As described above, in producing an SOI wafer, when the thickness X of the buried oxide film is X≦100, after carrying out the ion implantation with the ion implantation conditions being set such that the sum X+Y of the thickness of the buried oxide film and the thickness of the SOI layer satisfies a relation of X+Y>1500−14X in forming the ion-implanted layer, by carrying out the bonding process and the delaminating process and, thereafter, carrying out the thinning treatment of the SOI layer to make the SOI layer into a thin film having a predetermined thickness, there can be produced a high-quality SOI wafer having an SOI layer formed with a predetermined thickness and having a thin buried oxide film of 100 nm or less in thickness at a high yield without generating any void and any blister.

At that time, it is preferred that in forming the ion-implanted layer, the ion implantation is carried out with the ion implantation conditions being set such that the sum X+Y of the thickness of the buried oxide film and the thickness of the SOI layer becomes 390 nm or more when the thickness X of the buried oxide film is made into 80≦X≦100, such that X+Y becomes 810 nm or more when X is made into 50≦X<80, and such that X+Y becomes 1090 nm or more when X is made into 30≦X<50.

According to the SOI wafer production method of the present invention, by carrying out the ion implanting with the ion implantation conditions set as described above depending on the thickness X of the buried oxide film in forming the ion-implanted layer, generation of the voids and blisters can be surely prevented when delaminating the bonded wafer, and extremely high-quality SOI wafers can be easily produced.

The thinning treatment of the SOI layer is preferably carried out by a sacrificial oxidation treatment.

As described above, when thinning treatment of the SOI layer is carried out with a so-called sacrificial oxidation treatment in which an oxide film is formed on the SOI layer and the oxide film is removed, the SOI layer can be made easily into a thin film having a predetermined thickness without degrading the uniformity of the film thickness of the SOI layer.

And, according to the present invention, there is provided an SOI wafer produced by the method of producing an SOI wafer of the present invention.

An SOI wafer produced by the method of producing an SOI wafer of the present invention can surely be a high-quality SOI wafer free from any blister and any void even when the thickness of its buried oxide film is as thin as 100 nm or less.

As set forth hereinabove, according to the present invention, it is possible to produce a high-quality SOI wafer having a buried oxide film with a small thickness of 100 nm or less at a high yield without generating any blister and any void.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE INVENTION AND A PREFERRED EMBODIMENT

Figure 1:
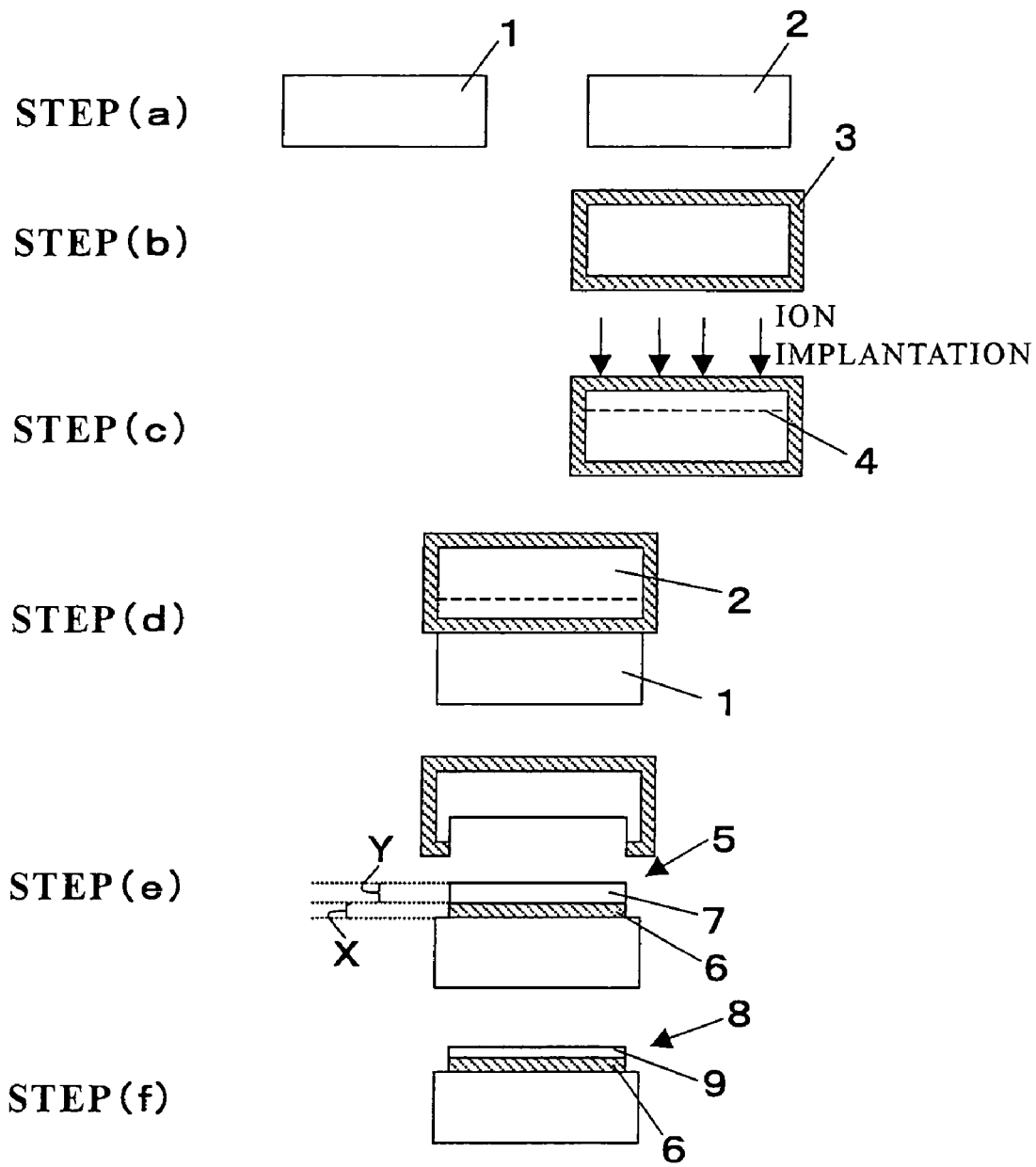
FIG. 1 is a flowchart illustrating an example of a method of producing an SOI wafer according to an ion implantation delamination method in the present invention.
Figure 2:
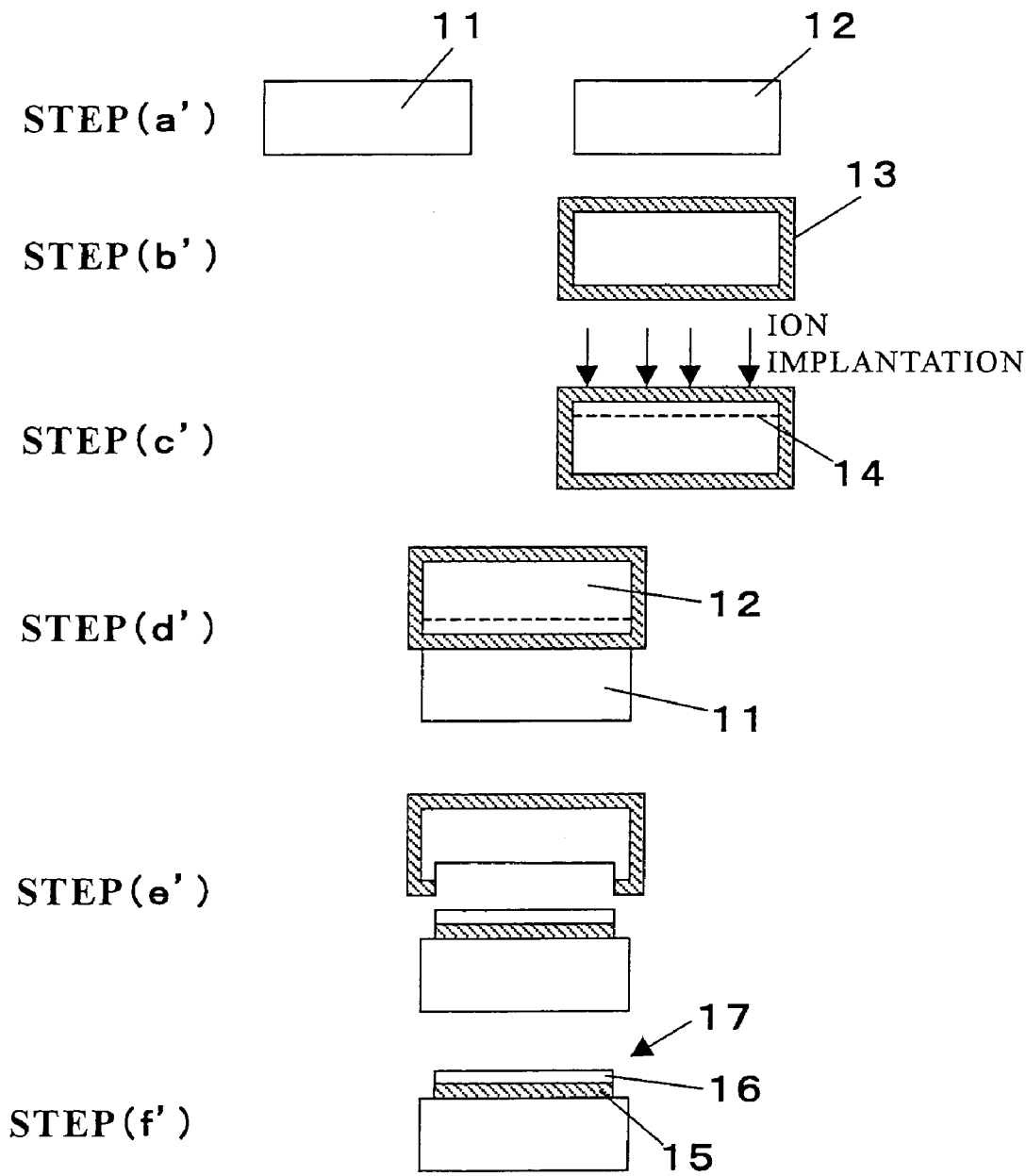
FIG. 2 is a flowchart illustrating a method of producing an SOI wafer by a conventional ion implantation delamination method.
Figure 3:
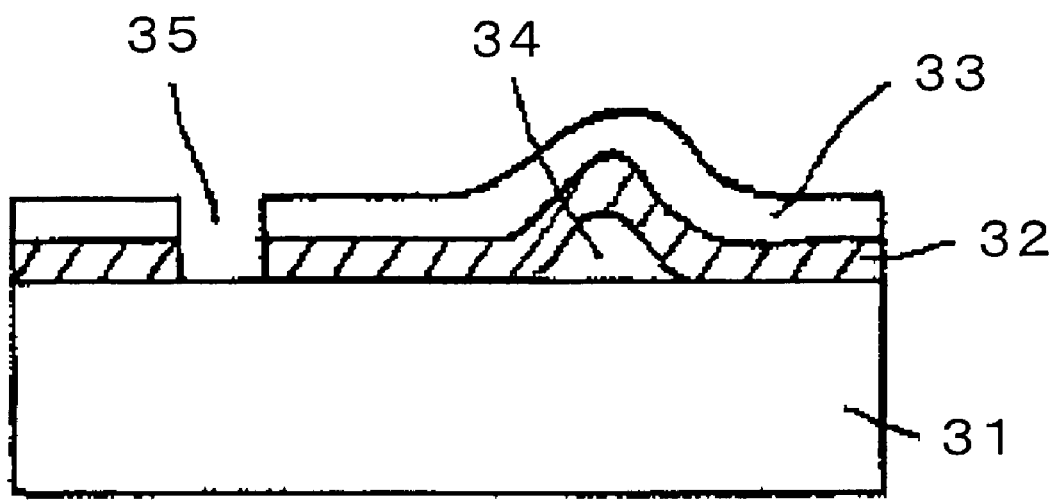
FIG. 3 is a schematic explanatory diagram illustrating schematically a void and a blister generated in an SOI wafer.

Embodiments of the present invention will now be described. It is to be noted however that the present invention is not limited thereto.

Conventionally, when producing an SOI wafer having a buried oxide film having the thickness of 100 nm or less is attempted using an ion implantation delamination method, blisters and voids tend to be generated in a delaminating process after bonding and, there have been problems that, as the thickness of the buried oxide film becomes thinner, good wafers become more difficult to obtain because failures of blisters and voids are generated frequently, and the yield is decreased.

As to the generation of these blisters and voids, it has been considered that degassing occurs at the bonding interface due to organic material etc. adhering to bonding planes during the delaminating heat treatment and, the gas generated during the delaminating heat treatment can be taken in the buried oxide film when the buried oxide film is thick to some extent, however, not all of the gas generated during the delaminating heat treatment can be taken in when the buried oxide film is thin because the volume of the gas capable of being taken in is reduced, then, blisters and voids are generated due to the remaining gas. Furthermore, because blisters and voids are generated for such reason, it has been considered that the numbers of blisters and voids generated increases as the buried oxide film is made further thinner.

Then, in order to solve the above problem, the inventors have actively studied and discussed a method of producing a high-quality SOI wafer having a buried oxide film having a small thickness without generating any blister and any void, using an ion implantation delamination method. As a result, the inventors have found that, when producing an SOI wafer having a buried oxide film having a thickness of 100 nm or less, blisters and voids tend to be generated for the above reason, however, the rigidity of the SOI layer can be increased and the generation of blisters and voids can be prevented by increasing the thickness of the SOI layer immediately after delaminating the bonded wafer, and that the generation of blisters and voids can be securely prevented by further increasing the thickness of the SOI layer immediately after the delaminating, according to the decrease of the buried oxide film even when the thickness of the buried oxide film is reduced further.

Then, the inventors, first, carried out the following experiment and research in order to clarify the relationship between the thickness of the buried oxide film and the SOI layer in the SOI wafer immediately after delaminating the bonded wafer at the ion-implanted layer, and the numbers of blisters and voids generated.

[Experiment]

A plurality of bond wafers, each produced by forming a silicon oxide film on the surface of a silicon single crystal wafer of p-type and of crystal orientation <100>, having the diameter of 200 mm, were prepared for the thickness of the silicon oxide film of 50 nm, 80 nm, 100 nm or 150 nm respectively. Ion-implanted layers were formed at various depths in the surface portion of the bond wafers by implanting hydrogen ion at various implanting energies through the oxide films.

Next, each of these bond wafers was bonded respectively with a silicon wafer being a base wafer through the oxide film and, thereafter, the resultant bonded wafers were delaminated at the ion-implanted layers by subjecting them to a heat treatment at 500° C. to produce bonded SOI wafers.

Figure 4:
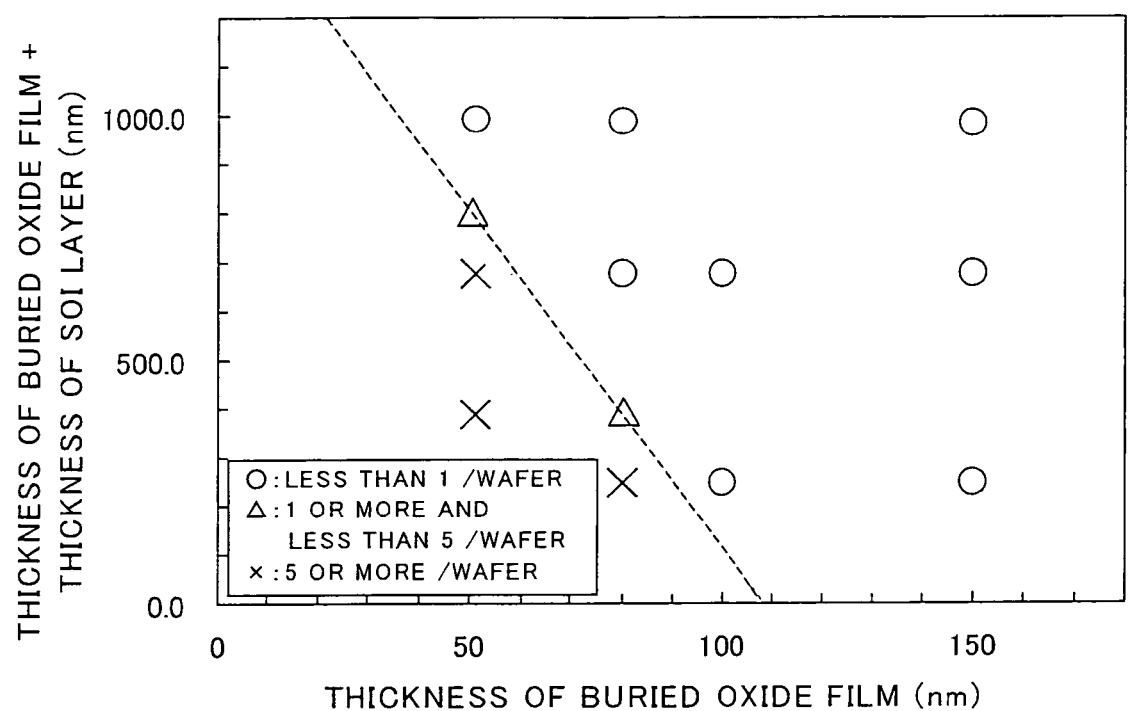
FIG. 4 is a graph illustrating the relationship between the thickness of buried oxide films and SOI layers, and the numbers of blisters/voids generated.

Thereafter, the thickness of the SOI layers were measured for the produced SOI wafers using a multi-layer film spectroscopic ellipsometer (manufactured by SOPRA) and the numbers of blisters and voids generated were counted for each wafer by inspecting visually the surface of each SOI wafer, and the average number thereof was calculated. Then, a graph was prepared by plotting those wafers having the calculated average numbers of blisters and voids generated of less than 1 number/wafer as success (○), those having that of 1 or more and less than 5 number/wafer as almost success (Δ) and those having that of 5 or more number/wafer as failure (X) in a graph having the axis of abscissa for the thickness (X [nm]) of the buried oxide film and the axis of ordinate for the total thickness (X+Y [nm]) of the buried oxide film and the SOI layer. FIG. 4 shows the graph prepared as above, illustrating the relationship between the thickness of the buried oxide films and the SOI layers, and the numbers of blisters/voids generated. Based on this graph, creation of success/failure determination criterion in which the boundary line lies around the "almost success" level was attempted.

As shown in FIG. 4, it has been found that blisters and voids tend to be generated more easily as the thickness of the buried oxide film is reduced in the cases where the thickness of the buried oxide film is 100 nm or less, and generation of blisters and voids can be prevented more securely as the total thickness of the buried oxide film and the SOI layer is increased. Furthermore, it has been found that the boundary line to be the success/failure determination criterion is an approximated line X+Y=1500−14X based on the two points being "almost success". On the other hand, it has been found that there are almost no blisters nor voids generated in the cases where the thickness of the buried oxide film exceeds 100 nm.

Then, the inventors completed the present invention by actively continued consideration based on the findings obtained from the above experiment and research.

That is, the method of producing an SOI wafer of the present invention is characterized in that, in a method of producing an SOI wafer using an ion implantation delamination method, assuming that X [nm] represents the thickness of the buried oxide film and Y [nm] represents the thickness of the SOI layer in the SOI wafer immediately after delaminating at the ion-implanted layer, when the thickness X of the buried oxide film is X≦100, on the occasion of formation of the ion-implanted layer, the ion implantation is carried out with the ion implantation conditions being set such that the sum X+Y of the thickness of the buried oxide film and the thickness of the SOI layer satisfies X+Y>1500−14X, then, the bonding process and the delaminating process are carried out and, thereafter, a thinning treatment of the SOI layer is carried out to make the SOI layer into a thin film having a predetermined thickness.

Now, the method of producing an SOI wafer of the present invention will be described in detail referring to drawings and taking the case where two silicon wafers are bonded to each other, as example. However, the present invention is not limited thereto. Here, FIG. 1 is a flowchart illustrating an example of a method of producing an SOI wafer by an ion implantation delamination method according to the present invention.

First, two silicon mirror wafers are prepared (Step (a)). Of these two silicon wafers, one wafer is a base wafer 1 to be a supporting substrate conforming to the specification of a device and the other wafer is a bond wafer 2 to be an SOI layer.

Next, in Step (b), at least one of the wafers, the bond wafer 2 in this example is subjected to a thermal oxidation treatment to form an oxide film 3 on the surface thereof. In this case, the oxide film is formed such that the thickness of the oxide film formed on the surface of the bond wafer basically becomes the thickness of the buried oxide film that the SOI wafer should finally have when the SOI wafer has been produced. The thickness of the buried oxide film of the SOI wafer obtained finally is determined by the product standard, however, according to the present invention, it may be 100 nm or less and, particularly 80 nm or less, and further particularly 50 nm or less.

In this Step (b), a wafer on which the oxide film may be formed is not limited to the bond wafer, and an oxide film may be formed on the base wafer or oxide films may be formed on both of the base wafer and the bond wafer. For example, in the case where oxide films are formed respectively on both of the base wafer and the bond wafer, the oxide film may be formed such that the total thickness of the oxide films formed on the surfaces of both wafers becomes the final thickness of the buried oxide film.

Then, in Step (c), an ion-implanted layer 4 parallel to the wafer surface is formed at the average penetration depth of ion by implanting at least one kind of ion of hydrogen ion ($H^+$ ion, $H^-$ ion, $H_2^+$ ion etc.) and a rare gas ion into the surface portion of the bond wafer 2 in which the oxide film 3 is formed on its surface. The average penetration depth of ion is almost in proportion to the ion implantation energy, and when the same energy is applied, the same penetration depth can be obtained for both of silicon and a silicon oxide film. Therefore, once a targeted average penetration depth is determined, the ion implantation energy for it can be easily set.

In this case, assuming that the thickness of a buried oxide film 6 is presented with X [nm] and the thickness of an SOI layer 7 is presented with Y [nm] in an SOI wafer 5 immediately after delaminating a bonded wafer at the ion-implanted layer 4 in Step (e) described as follows, when the thickness X of the buried oxide film 6 is X≦100 (X is basically same as the thickness of the oxide film 3), in forming the ion-implanted layer 4 in this Step (c), the ion implantation is carried out with the ion implantation conditions such as the implantation energy etc. being set such that the sum X+Y of the thickness of the buried oxide film 6 and the thickness of the SOI layer 7 satisfies X+Y>1500−14X.

AS for the thickness Y [nm] of the SOI layer 7, considering the polishing stock removal for removing the damages and surface roughness which remain on the wafer after delamination and the rigidity of the SOI layer, in addition to the need to satisfy the above equation, the thickness Y is preferably 100 nm or more and, more preferably, 300 nm or more.

After the ion-implanted layer 4 is formed on the bond wafer 2 as described above, in Step (d), the surface of the bond wafer 2, into which ion has been implanted is superposed on the base wafer 1 through the oxide film 3 and brought into close contact with it. At this moment, the wafers can be bonded to each other without using adhesive etc. by, for example, contacting the surfaces of the two wafers to each other in a clean atmosphere at the room temperature.

Then, after bonding the wafers to each other, in Step (e), the SOI wafer 5 in which the SOI layer 7 is formed on the buried oxide film 6 can be produced by delaminating the bonded wafer at the ion-implanted layer 4 of the bond wafer 2 serving as the boundary plane. This delaminating of the bond wafer 2 can be easily carried out by, for example, subjecting to a delaminating heat treatment at about 500° C. or higher in an inert gas atmosphere, or the delaminating of the wafer can be carried out omitting the heat treatment by subjecting the surface of the bond wafer before bonding to a plasma treatment previously to make it activated, followed by bonding the wafers to each other.

At this moment, according to the present invention, when the ion-implanted layer 4 is formed in Step (c) as described above, the ion implantation has been carried out such that the sum X+Y of the thickness of the buried oxide film 6 and the SOI layer 7 satisfies X+Y>1500−14X. Therefore, the SOI layer immediately after the delaminating has a large thickness and high rigidity, and it can prevent the blisters and voids from being generated even though the buried oxide film is thin. Furthermore, according to the present invention, since the delaminating of the bond wafer is carried out using the ion implantation delamination method, the uniformity of the film thickness of the SOI layer may be very excellent.

Thereafter, the SOI wafer obtained is subjected to a thinning treatment of the film thickness in Step (f) to make the SOI layer into a thin film having a predetermined thickness. As the thinning treatment, a so-called sacrificial oxidation treatment comprising forming an oxide film on the SOI layer and removing the oxide film can be used, and furthermore, polishing, etching etc. can be used in a proper combination if necessary. Especially, it is preferable that the thinning of the SOI layer is carried out by mainly the sacrificial oxidation treatment. The sacrificial oxidation treatment may be carried out for several times if necessary.

For example, when a sacrificial oxidation treatment is carried out in a manner where the SOI wafer after the delaminating is subjected to a heat treatment in an oxidizing atmosphere to form an oxide film on the surface of the SOI layer and thereafter the oxide film formed on the surface of the SOI layer is removed in an etching process with, for example, a solution containing HF, the uniformity of the film thickness of the SOI layer is not degraded and, furthermore, the SOI layer can be thinned easily to a predetermined thickness removing damages and contaminants of heavy metal and the like in the vicinity of the wafer surface generated when the ion implantation has been carried out in Step (c).

In the case where the thinning of the SOI layer is carried out by a sacrificial oxidation treatment as described above, since damages have been generated in the vicinity of the surface of the SOI layer immediately after the delaminating as above, OSFs may be generated when the SOI wafer 5 after the delaminating is directly subjected to a thermal oxidation at a high-temperature exceeding 1,000° C. Therefore, the sacrificial oxidation treatment should be carried out at a temperature of 1,000° C. or lower and, preferably at 900° C. or lower, or it is preferable to carry out the sacrificial oxidation treatment after reducing the damages by subjecting to a heat treatment once in an atmosphere of hydrogen or argon.

Furthermore, the surface roughness of the SOI layer can also be improved by carrying out a polishing with a small amount of polishing stock removal (for example, the polishing stock removal is around several nms to 100 nm) called touch polishing after carrying out the sacrificial oxidation treatment.

By using the method described as above, the SOI wafer 8 having a high quality in which the SOI layer 9 having a predetermined thickness is formed on the buried oxide film 6 having the thickness of 100 nm or less can be produced at a good yield without generating any voids and any blisters.

In such a method of producing an SOI wafer according to the present invention, when the ion-implanted layer is formed in Step (c), in the case where the thickness of the buried oxide film is made into, for example, 80 nm or more and 100 nm or less (80≦X≦100), on the boundary line serving as the success/failure determination criterion shown in the above FIG. 4, X+Y is approximately 380 when X is its minimum of 80. Therefore, when the ion implantation conditions such as the implantation energy etc. are set such that the sum X+Y of the thickness of the buried oxide film and the SOI layer becomes 390 nm or more, blisters and voids can be securely reduced with X in a range of 80≦X≦100.

Furthermore, since blisters and voids tend to be generated more easily when the thickness of the buried oxide film is reduced further as described above, based on the boundary line serving as the success/failure determination criterion shown in the above FIG. 4, it is preferable that the ion implantation is carried out with the ion implantation conditions being set such that, for example, the sum X+Y of the thickness of the buried oxide film and the SOI layer becomes 810 nm or more in the case where the thickness X of the buried oxide film is made into 50≦X<80 and X+Y becomes 1090 nm or more in the case where X is made into 30≦X<50. By carrying out the ion implantation with the ion implantation conditions being set in response to the thickness of the buried oxide film as described above, a very-high-quality SOI wafer having a buried oxide film having a small thickness can be produced easily and efficiently, preventing securely the generation of voids and blisters.

Meanwhile, if the sum X+Y of the thickness of the buried oxide film and the SOI layer is made excessively large in order to prevent blisters and voids from being generated, this may result in reduction of the productivity because it is necessary to perform the thinning treatment for a long time when making the SOI wafer into a thin film thereafter. Therefore, it is preferable to carry out the ion implantation with the ion implantation conditions being set such that for example, the sum X+Y becomes 900 nm or less when the thickness X of the buried oxide film is made into 80≦X≦100, such that X+Y becomes 1300 nm or less when X is made into 50≦X<80, and such that X+Y becomes 1600 nm or less when X is made into 30≦X<50.

EXAMPLES

The following example and comparative example are being submitted to further explain the present invention specifically. However, the present invention is not limited thereto.

Examples 1 and 2

40 silicon wafers of p-type and of crystal orientation <100>, having the diameter of 200 mm, of which the one surface has been mirror polished were prepared, and 20 wafers as bond wafers of these 40 wafers is subjected to a thermal oxidation treatment to form an oxide film having the thickness of 50 nm on the surface of each wafer. Next, an ion-implanted layer was formed in the surface portion of each of the silicon wafers by ion-implanting hydrogen ion (H⁺) into the whole surface of each wafer through the oxide film formed. In this case, the ion implantation was carried out with the ion implantation conditions being set at the implantation energy of 90 keV and the dose of $6.5\times10^{16}/cm^2$ such that the sum X+Y of the thickness of a buried oxide film and an SOI layer obtained after a delaminating process carried out later becomes securely 810 nm or more.

Then, the 20 bond wafers in which the ion-implanted layers were formed were bonded respectively to the rest of 20 silicon wafers (base wafers) through the oxide film having the thickness of 50 nm at the room temperature. Thereafter, SOI wafers were produced by subjecting the bonded wafers obtained to a heat treatment at 500° C. for 30 minutes to delaminate it at the ion-implanted layer.

Thereafter, the thickness of the SOI layer of each of the 20 SOI wafers produced was measured with a multi-layer film spectroscopic ellipsometer (manufactured by SOPRA) and the numbers of blisters and voids generated were counted by visual inspection. And, the average values thereof were calculated respectively.

As a result, it was found that the thickness of the SOI layer was 775 nm on an average (that is, X+Y=825 nm) and the numbers of blisters and voids generated were very few as 0.5 number/wafer on an average.

Furthermore, 10 wafers of the 20 SOI wafers produced as above (which were untreated after the delaminating process) were subjected to Ar-annealing at 1,200° C. for an hour to perform flattening and damage removing of the SOI layers. Then, the SOI layers were made into thin films by subjecting to a sacrificial oxidation treatment 4 times in which a pyrogenic oxidation at 1,100° C. followed by removal of the oxide film using 10% HF solution is performed, and thereby, SOI wafers in each of which an SOI layer having the thickness of 100 nm was formed on a buried oxide film having the thickness of 50 nm were produced (Example 1).

On the other hand, the rest of the 10 wafers of the 20 SOI wafers produced as above were subjecting to a sacrificial oxidation treatment in which a pyrogenic oxidation at 900° C. followed by a heat treatment in argon atmosphere at 1,100° C. for 2 hours is performed to enhance the bonding force and thereafter the oxide films are removed using 10% HF solution. Next, a touch polishing is performed with the polishing stock removal of 100 nm, after that a sacrificial oxidation treatment is performed in which a pyrogenic oxidation at 1,100° C. followed by removal of the oxide film using 10% HF solution is performed. Thereby, the SOI layers were made into thin films, and SOI wafers in each of which an SOI layer having the thickness of 300 nm was formed on a buried oxide film having the thickness of 50 nm were produced (Example 2).

As a result of a visual inspection conducted for the 2 kinds of SOI wafers of which each SOI layer has the desired thickness produced as above, it could be verified similarly to the above that the numbers of blisters and voids generated were very few as 0.5 number/wafer on an average respectively.

Comparative Example 20 silicon wafers similar to those for the above Examples 1 and 2 were prepared and 10 wafers (bond wafers) of those silicon wafers are subjected to a thermal oxidation treatment to form an oxide film having the thickness of 50 nm on the surface of each wafer. Next, the ion implantation of hydrogen ion (H⁺) was carried out with the ion implantation conditions being set at the implantation energy of 40 keV and the dose of $6.5\times10^{16}/cm^2$ to form an ion-implanted layer in the surface portion of each of the silicon wafers.

Then, a bonding process and a delaminating process are performed similarly to the above Example 1 and Example 2, and thereby, SOI wafers in each of which an SOI layer was formed on a buried oxide film were produced.

Thereafter, the thickness of each of the SOI layers of the SOI wafers produced was measured and the numbers of blisters and voids were counted by visual inspection. And the average values thereof were calculated respectively. As a result, the thickness of the SOI layer was 300 nm on an average and the numbers of blisters and voids generated were much more as 15 number/wafer on an average compared to that of Examples 1 and 2.

The present invention is not limited to the above-described embodiment. The above-described embodiment is a mere example, and those having substantially the same structure as that described in the appended claims and providing the similar action and effects are included in the scope of the present invention.

What is claimed is:

1. A method of producing an SOI wafer in which an SOI layer is formed on a buried oxide film by, at least implanting at least one kind of ion of hydrogen ion and a rare gas ion into the surface portion of a bond wafer to form an ion-implanted layer, bonding the bond wafer and a base wafer to each other through an oxide film, and delaminating the resultant bonded wafer at the ion-implanted layer, wherein assuming that X [nm] represents the thickness of the buried oxide film and Y [nm] represents the thickness of the SOI layer in the SOI wafer immediately after delaminating at the ion-implanted layer, when the thickness X of the buried oxide film is $X \leq 100$, in forming the ion-implanted layer, the ion implantation is carried out with the ion implantation conditions being set such that the sum X+Y of the thickness of the buried oxide film and the thickness of the SOI layer satisfies X+Y>1500−14X, after which the bonding process and the delaminating process are carried out and, thereafter, a thinning treatment of the SOI layer is carried out to make the SOI layer into a thin film having a predetermined thickness.

2. The method of producing an SOI wafer according to claim 1, wherein in forming the ion-implanted layer, the ion implantation is carried out with the ion implantation conditions being set such that the sum X+Y of the thickness of the buried oxide film and the thickness of the SOI layer becomes 390 nm or more when the thickness X of the buried oxide film is made into $80 \leq X \leq 100$, such that X+Y becomes 810 nm or more when X is made into $50 \leq X < 80$, and such that X+Y becomes 1090 nm or more when X is made into $30 \leq X < 50$.

3. The method of producing an SOI wafer according to claim 1, wherein the thinning treatment of the SOI layer is carried out by a sacrificial oxidation treatment.

4. The method of producing an SOI wafer according to claim 2, wherein the thinning treatment of the SOI layer is carried out by a sacrificial oxidation treatment.

5. An SOI wafer produced by the method of producing an SOI wafer according to claim 1.

6. An SOI wafer produced by the method of producing an SOI wafer according to claim 2.

7. An SOI wafer produced by the method of producing an SOI wafer according to claim 3.

8. An SOI wafer produced by the method of producing an SOI wafer according to claim 4.

* * * * *